US009876327B2

United States Patent
Felder et al.

(10) Patent No.: US 9,876,327 B2
(45) Date of Patent: Jan. 23, 2018

(54) HERMETICALLY SEALED CONTAINER FOR LASER DEVICE

(71) Applicant: Camlin Technologies (Switzerland) Limited, Zurich (CH)

(72) Inventors: Ferdinand Felder, Zurich (CH); Matthias Fill, Zurich (CH); Oliver Meier, Zurich (CH); Hans Zogg, Danikon (CH)

(73) Assignee: Camlin Technologies (Switzerland) Limited (CH)

( * ) Notice: Subject to any disclaimer, the term of this patent is extended or adjusted under 35 U.S.C. 154(b) by 0 days.

(21) Appl. No.: 15/029,050

(22) PCT Filed: Oct. 13, 2014

(86) PCT No.: PCT/EP2014/071907
§ 371 (c)(1),
(2) Date: Apr. 13, 2016

(87) PCT Pub. No.: WO2015/055589
PCT Pub. Date: Apr. 23, 2015

(65) Prior Publication Data
US 2016/0261089 A1      Sep. 8, 2016

(30) Foreign Application Priority Data
Oct. 14, 2013   (EP) .................................... 13188545

(51) Int. Cl.
*H01S 5/022*       (2006.01)
*H01S 5/024*       (2006.01)
(Continued)

(52) U.S. Cl.
CPC ............ *H01S 5/022* (2013.01); *H01S 5/0222* (2013.01); *H01S 5/02296* (2013.01);
(Continued)

(58) Field of Classification Search
CPC ...... H01S 5/022; H01S 5/041; H01S 5/02415; H01S 5/3022; H01S 5/183; H01S 5/14;
(Continued)

(56) References Cited

U.S. PATENT DOCUMENTS 4,972,428 A * 11/1990 Hinz ..................... H01S 3/0305
                                                                  372/102
4,990,322 A *  2/1991 Pollock ................. H01S 3/1681
                                                                  204/157.48
(Continued)

OTHER PUBLICATIONS

International Search Report and Written Opinion for corresponding PCT Application No. PCT/EP2014/071907, dated Jan. 28, 2015.
(Continued)

*Primary Examiner* — Xinning Niu
(74) *Attorney, Agent, or Firm* — Gardner, Linn, Burkhart & Flory, LLP

(57) ABSTRACT

The present invention relates to a first container with an internal space for accommodating a vertical external cavity surface emitting laser device. Said first container hermetically seals said internal space from an external space, wherein said first container has at least one wall with at least one first through-opening. Said at least one first through-opening is adapted for passage of an optical pump beam from the external space into the internal space, and/or for passage of a laser emission beam from the internal space into the external space. Moreover, said at least one first through-opening is hermetically sealed by a sealing mirror, wherein said sealing mirror is adapted to form an external cavity of the vertical external cavity surface emitting laser device with a second mirror in the internal space. Furthermore, the present invention relates to laser device with such a first container and to an assembly method of the laser device.

21 Claims, 1 Drawing Sheet

(51) Int. Cl.
  *H01S 5/04* (2006.01)
  *H01S 5/14* (2006.01)
  *H01S 5/183* (2006.01)
  *H01S 5/30* (2006.01)

(52) U.S. Cl.
  CPC .......... *H01S 5/02415* (2013.01); *H01S 5/041* (2013.01); *H01S 5/14* (2013.01); *H01S 5/183* (2013.01); *H01S 5/3022* (2013.01); *H01S 2301/163* (2013.01)

(58) Field of Classification Search
  CPC ............... H01S 5/02296; H01S 5/0222; H01S 2301/163
  See application file for complete search history.

(56) References Cited

U.S. PATENT DOCUMENTS

| | | | |
|---|---|---|---|
| 6,422,766 B1* | 7/2002 | Althaus | G02B 6/4208 385/92 |
| 6,788,724 B2 | 9/2004 | Sell et al. | |
| 6,953,291 B2 | 10/2005 | Liu | |
| 7,572,068 B2 | 8/2009 | Nagano et al. | |
| 2002/0003670 A1* | 1/2002 | Oliva | G02B 5/1876 359/668 |
| 2004/0165641 A1* | 8/2004 | Garnache | H01S 5/02288 372/97 |
| 2007/0036194 A1 | 2/2007 | Govorkov et al. | |
| 2008/0130075 A1* | 6/2008 | Kumagai | G02B 5/32 359/15 |
| 2011/0134947 A1* | 6/2011 | Rahum | H01S 3/09415 372/29.015 |
| 2011/0150020 A1 | 6/2011 | Haase et al. | |

OTHER PUBLICATIONS

European Search Report for corresponding European Application No. 13188545.1, dated Apr. 15, 2014.

Fill, M. et al., "PbSe quantum well mid-infrared vertical external cavity surface emitting laser on Si substrates," 2011 American Institute of Physics, Journal of Applied Physics 109, 093101, six pages (2011).

Felix, C. L. et al., "Low-threshold optically pumped $\lambda=4.4$ µm vertical cavity surface-emitting laser with a PbSe quantum-well active region," 2001 American Institute of Physics, Applied Physics Letters, vol. 78, No. 24, pp. 3770-3772, Jun. 11, 2001.

* cited by examiner

HERMETICALLY SEALED CONTAINER FOR LASER DEVICE

CROSS REFERENCE TO RELATED APPLICATION

The present application claims the priority benefits of International Patent Application No. PCT/EP2014/071907, filed on Oct. 13, 2014, which is hereby incorporated herein by reference in its entirety.

TECHNICAL FIELD

The present invention relates to a hermetically sealed container for an optically pumped laser device and to a laser device with such a container and to a method of assembly of such a laser device.

BACKGROUND OF THE INVENTION

Semiconductor lasers for the mid-infrared are known since the 1970s. The original devices are edge emitters, pumped electrically in the form of a laser diode, have to be cooled cryogenically, and, depending on design, emit in a spectral range from 2 micrometers to 20 micrometers wavelength. This range will in the following be called the "mid-IR" range. As semiconductor material, narrow gap IV-VI semiconductors like PbSnTe, PbEuTe, PbSrTe, where Te may be fully or partially replaced by Se or S in various compositions, were used.

Later, III-V based lasers using semiconductors like GaAs, GaSb, InP, or InSb and compounds thereof were developed for the mid-infrared, too. Again, these are typically laser diodes that are pumped electrically and edge-emitting. Wavelengths up to about 3.5 micrometers are reached. As an alternative, quantum and interband cascade laser diodes (QCL, ICL), again edge emitters, have proven to be useful. Their spectral range covers wavelengths from about 3 micrometers up to larger than 20 micrometers. QCL and ICL need a sophisticated layered structure, consisting of many hundreds of semiconductor layers grown monolithically on III-V substrates. Some of these designs operate up to room temperature and in continuous wave.

A disadvantage of edge emitting laser diodes is their strong astigmatic emission beam with a very high divergence angle, e.g. 60°, in one direction. To focus or collimate this beam to one with Gaussian-like shape, sophisticated and expensive optical elements are needed, and a considerable part of the output power is lost. The large aperture in one direction is due to the very thin layers of the gain structure in order to keep the threshold current low.

Much is gained if the semiconductor laser emits vertically with respect to the surface. With a typical beam exit diameter of at least several tens of micrometers, a narrow circular output cone results with an opening angle of a few degree only. Such lasers exhibit a "good beam quality" emission in a quasi-perfect radial-symmetric Gaussian shape with very small divergence angles, e.g. below 2°, and with a beam quality factor $M^2$ approaching unity. Contrarily, the factor $M^2$ is much higher in edge-emitting lasers. Such Vertical Cavity Surface Emitting Lasers (VCSEL), also called semiconductor disk lasers, are fabricated monolithically and are often electrically pumped. For higher output powers often an external cavity is used, in so called Vertical External Cavity Surface Emitting Lasers (VECSEL). They are often optically pumped to fully utilize the different construction mechanism to obtain high beam quality, low losses, and high power. Here, the alignment of the pump beam in regard to the spot of the cavity mode is crucial for efficiency. The diameter of both is in the range of few to several hundred micrometers, depending on cavity length, mirror curvatures, emission mode order, and structuring of the semiconductor surface. The alignment and diameter of the pumping spot in regard to the cavity mode spot is essential for efficiency. The misalignment tolerance of the both spots is in the range of a few micrometers, depending on cavity length, mirror curvature, and transversal emission mode order. VCSEL as well as VECSEL are commonly used e.g. for telecommunication applications. While VCSEL are limited to low power applications, very high powers have been reached with VECSEL.

For VECSEL based on III-V semiconductors, the longest laser mid-IR wavelengths are around 3 micrometers. VECSEL using IV-VI materials may, however, cover the whole mid-infrared range. Such devices were described in M. Fill, F. Felder, M. Rahim, A. Khiar, R. Rodriguez, H. Zogg, A. Ishida, IV-VI mid-infrared VECSEL on Si-substrate, Proc. SPIE, 82420H, 2012.

The operating temperature of all lasers in general is commonly stabilized thermo-electrically, in order to reduce noise of output power and emission wavelength. Furthermore, packaging is extremely important for long-term stability and ruggedness. Often, a temperature of light generating semiconductor layers below room temperature, generally also below the dew point, is desired for higher output power or to achieve a different emission wavelength. In this case, special measures need to be taken to avoid water condensation and to reduce heat leakage, for example by operating the laser in vacuum or in a suited dry gas mixture and by a hermetic sealing of the package. Common embodiments enclose the whole laser chip or setup within a standard package where the emission beam exits through a first window, e.g. U.S. Pat. No. 7,572,068, or through an optic component such as a lens, e.g. U.S. Pat. No. 6,953,291. In the case of optically pumped lasers, the pump beam enters the package either through said first or through an additional window, or a fiber delivering the pump beam is fed into the package without breaking the hermetic sealing, e.g. U.S. Pat. No. 6,788,724.

Current optically pumped laser devices are particularly impaired by limitations of available packaging types. Existing packages are designed with electrically pumped devices in mind, but are less than optimal for optically pumped devices. Packages are unsatisfying in regards to device wall-plug efficiency, stability, size, simplicity of the fabrication process, and price. In addition, the long-term stability of the laser characteristics lags behind the requirements of the application, as the thermal and mechanical stability of current packages is insufficient in the case of optical pumping.

SUMMARY OF THE INVENTION

The need for a window or a fiber feed-through leads to unnecessary reflections of the pump beam at every surface it passes. These losses lead to an increased wall-plug threshold, and thus to more waste heat dissipation and increased electronic noise. The same holds true for the output beam, which significantly reduces the output power. While anti-reflective coatings may reduce these losses to a few percent, costs are increased. In cases where it is desired to transmit the pump and the out-coupling beam through a single window, an even more complex anti-reflective coating is to be applied. In any such setup, the additional windows placed along the pumping beam path result in a larger optical path with a corresponding increased weight. In addition, the larger dimensions also introduce mechanical instabilities and further decrease the lasing performance through, e.g. increased lasing threshold or a sporadic flip of polarization. Furthermore, the alignment of the pump spot and the cavity spot is essential for efficiency. In cases where the semiconductor layers are stabilized below the dew point, this alignment process of the pumping optics has to be performed under a water-free atmosphere or, alternatively, either within or from the outside of the already sealed package. While in the latter case sophisticated manipulating mechanics are required, the movement's degrees of freedom and its precision are limited, yielding a less than optimal alignment, leading to a decreased lasing performance.

The present invention provides a container or a housing for a vertical external cavity surface emitting laser (VECSEL) device allowing for a more compact design and an improved wall-plug efficiency, while production costs of the laser device should be kept at a minimum.

A laser device, according to an aspect of the invention, includes a vertical external cavity surface emitting laser device, and a first container with an internal space accommodating the vertical external cavity surface emitting laser device. The first container hermetically seals said internal space from an external space. The first container comprises at least one container wall with at least one first through-opening. The at least one first through-opening is adapted for passage of an optical pump beam from the external space into the internal space. The first container comprises a sealing mirror, wherein said at least one first through-opening is hermetically sealed by the sealing mirror such that said first through-opening with sealing mirror is an entrance for an optical pump beam. The sealing mirror is adapted to form part of an external cavity of the vertical external cavity surface emitting laser device in the internal space.

Thus, the laser device includes a first container with an internal space for accommodating a vertical external cavity surface emitting laser device,
wherein said first container hermetically seals said internal space from an external space,
wherein said first container comprises at least one container wall with at least one first through-opening,
wherein said at least one first through-opening is adapted:
for passage of an optical pump beam from the external space into the internal space, and/or
for passage of a laser emission beam from the internal space into the external space,
wherein
said first container comprises a sealing mirror, wherein said at least one first through-opening is hermetically sealed by said sealing mirror, and wherein said sealing mirror is adapted to form part of an external cavity of the vertical external cavity surface emitting laser device in the internal space.

The sealing mirror is adapted to form part of the external cavity of the vertical external cavity surface emitting laser device in the internal space if it is usable as a cavity reflector in an arrangement of a plurality of cavity reflectors that form an optical resonator. Preferably, the sealing mirror is configured to form a mirror of a two-mirror cavity.

The first through-opening with the sealing mirror is hermetically sealed and transparent for the optical beam (pump or exit beam) intended to pass through. The pump beam is used to create the population inversion in an active region of the laser while the exit beam is provided for further use.

The terms "housing", "container", "case", and "enclosure" are regarded as synonyms, except where the context clearly indicates otherwise; also "mirror" and "reflector" are regarded as such synonyms.

Often, a through-opening is referred to as "window", extending from the internal space to the external space, thereby giving access e.g. for lasing-relevant light beams travelling between the internal and external space.

It is an aspect of the present invention to use part of the features of the laser device, such as the mirror that forms part of the external cavity, as a seal for the first container. This multiple use (sealing and reflector function) allows reducing absorbing or reflecting matter in the optical paths, and therefore enhances not only compactness of the device but also its wall-plug efficiency. The sealing mirror may be a distributed Bragg reflector (DBR) and provided on a chip which is either directly or indirectly attached, preferably glued on an inner or an outer surface of the first container to cover the first through opening in a gas-proof manner.

In one embodiment, the first container comprises at least one second through-opening, said at least one second through-opening being also hermetically sealed, e.g. by a germanium or a silicon platelet or chip. Said conventionally sealed second through-opening or window in the first container is preferably adapted:
for passage of the optical pump beam from the external space into the internal space, or
for passage of the laser emission beam from the internal space into the external space.

The first container may comprise one or a plurality of the first through-openings. Optionally, the first container may comprise additionally one or a plurality of the second through-openings.

According to an embodiment, the first container comprises only one first through-opening with one sealing mirror for feeding through pump and emission. According to another embodiment, the first container comprises one first through-opening with one sealing mirror and one second through-opening with a conventional seal is provided for. According to yet another embodiment, the first container comprises only a plurality of first through-openings, sealed with one or a plurality of sealing mirrors. According to yet another embodiment, the first container comprises a plurality of such first through-openings with one or more second through-opening(s), the latter being hermetically sealed with one or a plurality of conventional seals.

In an embodiment, the pump beam and the exit beam (i.e. the laser emission beam) are both fed through the same or one of the first through-opening(s). In another preferred embodiment, only one of both beams is fed through the at least one first through-opening(s) while the other beam is fed through the at least one second through-opening(s).

Hence, there is at least one first through-opening in the hermetically sealed first container which is hermetically sealed with a sealing mirror, wherein the sealing mirror is adapted to form part of the laser cavity, and wherein the thus sealed first through-opening is transparent for at least one pump beam from the external to the internal space and/or one exit beam from the internal space to the external space.

In contrast to a conventional sealing window, for example a transparent material, a sealing mirror has the additional functionality of reflecting light. Someone skilled in the art knows to provide the sealing object (sealing mirror or conventional seal) with required properties, such as reflection or anti-reflecting properties or the like. Technologies commonly used to produce such a mirror are multilayer stacks such as Distributed Bragg Reflectors or High Contrast Grating mirrors.

Embodiments of the present invention therefore provide a novel type of laser package, which is advantageous for optically pumped vertical external cavity surface emitting laser devices. It lifts limitations of existing package designs in particular in regards to the wall-plug efficiency and wavelength stability. Furthermore, using the herein described compact and hermetically sealed package type, alignment of the pumping optics, i.e. the optical pump device, is possible in a simple way while keeping the semiconductor layers of the active region of the laser at their dedicated operation temperature within the internal space, preferably at temperatures below the dew point. In addition, the laser cavity may be stabilized at its intended operation temperature simultaneously.

Energy and/or data lines or the like may be fed from the external space into the internal space by conventional techniques. Additional lines or links may be dispensed with by accommodating electronics and/or energy storage cells or the like within the internal space.

In order to keep the active region and/or the external cavity at low temperatures, the first container preferably features a cooling device. This cooling device is preferably accommodated completely within the internal space. It may, however, also be placed in the external space, i.e. outside the first container, while providing for a thermal link to the internal space, e.g. by means of a cold finger reaching from the external space through into the internal space. The cooling device may be adapted to at least partly cool down the internal space. Preferably the first container with the cooling device is adapted to cool down the sealing mirror and/or the second mirror, more preferably the entire external cavity, more preferably including the vertical external cavity surface emitting laser device and the active region to a stable temperature below about 20° C., preferably at a temperature of about or below 0° C.

The cooling device may include at least one cooling element, wherein the cooling element preferably is a Peltier element, or the like. The cooling element may be integrated into the device design as a load carrying part, i.e. the laser chip with the active region may be arranged directly or indirectly on the cooling element.

In general, the cooling element may be directly arranged on the object to be cooled or, alternatively, may be arranged indirectly or at a distance to the object to be cooled while a thermal link, e.g. a heat link improving layer or a cold finger, thermally links the cooling element to said object for cooling purposes.

It is a further aspect of the present invention to provide a laser device including the herein described first container as casing.

Accordingly, an aspect of the present invention provides a laser device comprising:
  a first container as described herein; and
  the vertical external cavity surface emitting laser device with at least one active region accommodated within the internal space of said first container,
  wherein the external cavity of the vertical external cavity surface emitting laser device is formed partly by the sealing mirror and by at least one second mirror,
  wherein the sealing mirror hermetically seals the at least one first through-opening.

The multiple use of the sealing mirror as a reflector of the external cavity and simultaneously as an optically transparent, hermetical seal for the at least one first through-opening in the container makes the laser device compact and efficient.

The laser device may be adapted or configured to feed the laser emission beam from the internal space to the external space through:
  the sealing mirror and the at least one first through-opening; and/or
  the second mirror and the at least one second through-opening.

In a particular embodiment, the laser device comprises the vertical external cavity surface emitting laser device that is adapted for being optically pumped with the optical pump device. The optical pump device may be accommodated in the external space, and/or directly or indirectly attached to the first container. This allows a precise alignment of the pump optics in the external space. The optical pump device may be glued with an adhesive onto the outer surface of the first container.

The gluing procedure of the optical pump device may include the hardening process of the adhesive, which may be done at a predefined temperature, wherein this predefined temperature is preferably substantially the same temperature at which the glue connection is kept later on during operation of the laser device. In order to achieve this, the first container may be kept in a second temperature-stabilized container under controlled atmosphere. This allows an optimal alignment of the pump optics and further avoids any misalignment during the hardening of the adhesive or thereafter, e.g. through tension due to thermal gradients or temperature changes. An alignment of the pump optics in the internal space would be cumbersome and more complex as there is much less space.

Alternatively, the temperature during gluing may be raised to higher temperatures, e.g. 30° C. to 60° C., in order to shorten hardening times.

The optical pump beam may be fed through:
  the second mirror and the at least one second through-opening; or
  the sealing mirror and the at least one first through-opening.

The optical pump device may include a light emitting diode as a pump light source. This is a reliable, readily available and cheap light source with compact dimensions and sufficient light output and efficiency. A focal length, extending from a focal plane of the focal lens of the light emitting diode to the active region of the vertical external cavity surface emitting laser device, ranges preferably from 0.5 to 3 millimeters, depending on the numerical aperture of the focal lens. This short distance allows for a compact and efficient design of the laser device.

The laser device may be adapted to have the optical pump beam passing through the sealing mirror and the at least one first through-opening and/or being adapted to have the laser emission beam passing through the second mirror and the at least one second through-opening.

The laser device may be adapted such that at least the active region of the vertical external cavity surface emitting laser device is cooled down to or below substantially 0° C. with the aforementioned cooling device. Said cooling device includes the least one cooling element, the cooling element being preferably a Peltier element. Said cooling element is preferably placed on the vertical external cavity surface emitting laser device or on a side wall of the first container, wherein in the latter case, preferably a heat link is provided, preferably in the form of a cold finger, wherein the heat link is arranged to thermally link the cooling element and the vertical external cavity surface emitting laser device. Advantageously, an additional metal layer or heat link improving layer may be arranged on the contact surfaces of the cooling element for establishing a better cooling contact of the cooling device to the vertical external cavity surface emitting laser device or the first container.

The active region may be a single active gain layer or a stack of active gain layers. The terms "active layer" and "active gain layer" are synonyms.

The active region within the internal space may not be directly attached to an outside wall of the first container. This allows to thermally insulate it and to cool it, if desired, without any water condensation at the inside or the outside of the package. This is important if water-soluble substrates, e.g. $BaF_2$, or materials, e.g. EuSe as low refractive index material in IV-VI semiconductor based distributed Bragg reflectors or mirrors, are used.

As the second mirror may be the substrate for the active region or layer, the second mirror may be kept at substantially the same temperature as the active region, i.e. at low temperatures achieved by means of the cooling device. Generally, the sealing mirror being provided on a chip and being attached to the first container has substantially the same temperature as the first container, which is, generally, higher than the temperature of the active region, the latter being preferably kept at about 0° C., the former being typically kept at about 20° C. or at the predefined temperature used during gluing.

A cavity length of the external cavity of the vertical external cavity surface emitting laser device has a length which is suitable for a predefined single-mode emission or suitable for a predefined multi-mode emission. In order to change the modality of the emission an additional optical element may be provided in the cavity, within the laser light path for tuning the external cavity to predefined emission characteristics, e.g. a single-mode emission.

The laser device may include a length change device. This length change device may be arranged within the first container. Said length change device is adapted for changing the cavity length of the external cavity. Said length change device includes at least one length change element, wherein said length change element is preferably a piezoelectric element.

Said length change element or the entire length change device is preferably arranged between the sealing mirror and the first container and/or between the second mirror and the first container such that a cavity length may easily be changed. The piezoelectric element may or may not form part of the first container's wall. Preferably, the length change device is directly attached (e.g. by means of an adhesive) to the inner surface of first container defining the internal space. Thereby, the first container is used as fix point, relative to which a length of the cavity is changeable. The length change device may also be indirectly attached to the first container, i.e. through intermediate layers or mechanical parts.

The cavity may be formed by the two aforementioned mirrors arranged with its length such that only one single laser mode is emitted whose wavelength may be shifted mode-hop free by altering the cavity length with a length change device. To achieve this change of cavity length, part of the package wall can preferably be a piezoelectric crystal with desired length change features.

The laser may be optically pumped and emits in the mid-infrared range of the electromagnetic spectrum. It may be fabricated using IV-VI materials. Other materials, for example II-VI or III-V semiconductors, may be used in this setup as well, with emission in the corresponding different range of the electromagnetic spectrum.

IV-VI VECSEL are important for infrared spectroscopy, where a narrow, monochromatic and wavelength tunable illumination is desirable. Such a device is described in M. Rahim, A. Khiar, M. Fill, F. Felder, H. Zogg, Continuously tunable single mode VECSEL at 3.3 μm wavelength for spectroscopy, Electron. Lett. 47, 18, p. 1037-1039, 2011. The wavelength tuning range extends from about 3.2 to 3.3 micrometers. The beam is single mode monochromatic, and tuning is completely mode-hop free.

Such tunable VECSEL may be used in a whole range of different applications. One such application is, e.g., trace gas spectroscopy for environmental monitoring. Other applications include trace gas, gas, or liquid spectroscopy for industrial process control or medical diagnosis of severe diseases. Combustion gases and hydrocarbons have very strong absorption lines at mid-infrared wavelengths from 2.5 to 10 micrometers. Gas spectroscopy sensors therefore offer a very high sensitivity when operating within this wavelength region. By making the whole mid-infrared accessible, the mid-IR laser modules allow to harvest the full potential of spectroscopic sensors. Other applications include medical surgery (tissue cutting or healing), material processing, or military countermeasures. There are two transparency windows in the mid-infrared (3 to 5 micrometers and 8 to 14 micrometers), where atmospheric absorption is minimal. This allows reliable signal transmission over long distances, i.e. free space communications.

Mirrors, through-opening seals, and/or the active region(s) may be formed to have a wedged shape such that planes through opposing surfaces of one mirror, through-opening seal, or active region are tilted with respect to one another by preferably substantially 0.5 to 2°. This kind of wedge shape avoids or at least reduces internal reflections within the wedged element, and preferably also between wedged elements, where necessary. Moreover, the wedged elements may be rotated with respect to one another (in particular with respect to the next-neighboring element, such that opposing surfaces are rotated or differently tilted) by preferably substantially 90° about an axis substantially normal to the respective surfaces. This further reduces reflections. Generally said wedging and/or rotation reduces fluctuations in the exit power of the laser device.

In order to increase wavelength stability and allow operation independent of environmental conditions, the package can be included into a second container, i.e. a standard package, e.g. HHL or butterfly, which itself allows temperature stabilization of the whole first hermetic package constituted by the first container at elements therein or thereon. If the outer package or the second container is itself hermetically sealed, the seal of the inner package can then be broken if desired.

Hence, the laser device may be provided with the second container, wherein the first container is accommodated completely within said second container, and wherein preferably said second container contains a water-free atmosphere and/or wherein a temperature within said second container is stabilized to a temperature ranging between 0° C. and 20° C. or another specific temperature using conventional means.

Hence, it is a method of operation to keep the temperature of the internal space constant at a temperature between e.g. 0° C. to 20° C. It is preferred to cool down elements such as the active region and the second mirror in the internal space to a temperature of about 0° C. while the atmosphere surrounding the first container is kept dry and at a specific temperature ranging e.g. from −15° C. to 40° C., preferably at a temperature in the range from −10° C. to 25° C., and preferably at about 20° C. The temperature at which the first container is kept may be adapted towards the environmental temperature if required, for example when operated in a hot or cold environment.

Operation modes may include:
1) Internal space temperature is kept at about 0° C., the temperature of the second container at about 20° C., and the outside temperature (environmental temperature) is kept between about −15° C. to about 40° C. This temperature setting is beneficial as the adhesive may be kept at constant temperature as from its application onwards. Moreover, the device may be operated in higher outside (environmental) temperatures.
2) Internal space temperature is kept at about 0° C., the temperature of the second container at about 2° C., and the outside temperature (environmental temperature) is kept between about −15° C. to about 20° C. This temperature setting is beneficial as a temperature difference close to the active region or the laser device is comparatively small (as compared with temperature setting 1).
3) Any variation of temperature, e.g. internal space temperature is kept at about 20° C., the temperature of the second container at about 40° C. This temperature setting is beneficial if applied e.g. in hot environments, e.g. in a desert with temperature around or above 40° C.

The present invention features therefore multiple improvements compared to other packaging solutions. Such improvements may be:
The process for aligning the pumping optics is significantly simplified when done outside of the sealed package, i.e. outside the first container. Manipulation and fixating can be done with standard tools in micrometer precision. The overall long-term mechanical stability is improved;
Device efficiency and output characteristics are improved due to the increased mechanical stability, and due to omitting unnecessary interfaces where losses occur;
The smaller dimensions of the optics and the omission of the additional window results in a reduced size and weight of the packaged device;
Stability of the emitted laser wavelength is increased, if a dual temperature stabilization (first container and second container temperature stabilization) is used for the semiconductor layers and the optical cavity; and/or
Device efficiency and output characteristics are further improved due to the alignment of the pumping optics at the intended operating temperatures.

Depending on the embodiment, only one or several of these improvements may be realized for a specific embodiment.

Aspects of the present invention lift the above discussed limitations of existing packages by using one mirror, i.e. the sealing mirror, of the VECSEL as hermetic seal of the enclosure, instead of an additional window. The internal space of the first container can be made water-free, in particular filled with a suitable dry air or gas mixture or vacuum. The laser cavity is formed within the enclosure while using the sealing mirror as one cavity mirror.

The pump beam may enter or the emission beam exit the enclosure or the first container through the sealing mirror, or both may do so. If the optical pump device is arranged in the external space, this may be done exclusively from the outside of the first container without breaking its seal. This allows the alignment of the optics with micrometer precision, especially if a structured laser emitting surface is used, to yield highest coupling efficiencies.

Therefore, the present invention relates to a laser device having a vertical external cavity surface emitting laser devise comprising a second mirror and an active gain layer stack of at least one semiconductor layer on at least one substrate, and a first mirror on a substrate, mounted within a sealed container, the container being either evacuated or refilled with a defined gas mixture, wherein at least one of the first and second mirrors hermetically seals an opening or window of the container and allows the pump beam to enter and/or the emission beam to exit, while the other mirror is mounted at some distance from the first mirror to form the external cavity of the vertical external cavity surface emitting laser devise.

It is a further aspect of the present invention to provide a method of assembly the laser device according to invention.

Hence, a method of assembling a laser device according to invention is provided, comprising or consisting of the steps of:
a) inserting at least one laser chip, the laser chip including the second mirror and the active layer, and further inserting the sealing mirror provided on a second chip, the cooling device, if any, and the length change device, if any, and mechanical parts, if any, into the internal space of the first container; and
attaching them (i.e. the laser chip, . . . ) as attachments directly or indirectly to the first container by means of soldering and/or gluing techniques; and
b) removing any mechanical parts that are only needed for assembling purposes, if necessary through additional dedicated openings in the first container;
c) removing water from the internal space of the first container, preferably by heating, filling-in of dry air or a dry gas, and hermetically sealing all through-openings and additional dedicated openings, if any; and
d) positioning and attaching the optical pump device in the external space preferably on the first container, wherein said attaching is preferably carried out by gluing preferably performed at a specific temperature, more preferably at substantially 20° C.; and
e) including the first container with all said attachments into the second container, if any, which second container preferably keeps the first container in a water-free atmosphere and/or at said specific temperature, preferably at a temperature in the range from 0° C. to 25° C., preferably at substantially 0° C. or below or between 0° C. and 20° C.

The term "mechanical parts" in step a) relates to parts like: a bearer for the sealing mirror, a bearer for the laser chip, various aiding parts for placement and distancing, all made e.g. of metal, and for distancing such as a plastic or metal foil or the like.

In order to remove any mechanical parts that are only needed for assembling purposes the first container features at least one dedicated further through-opening, which may be hermetically sealed after removing said mechanical parts from the internal space.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

Preferred embodiments of the laser device according to invention will be described in the following with reference to FIGS. 1 to 6.

Figure 1:
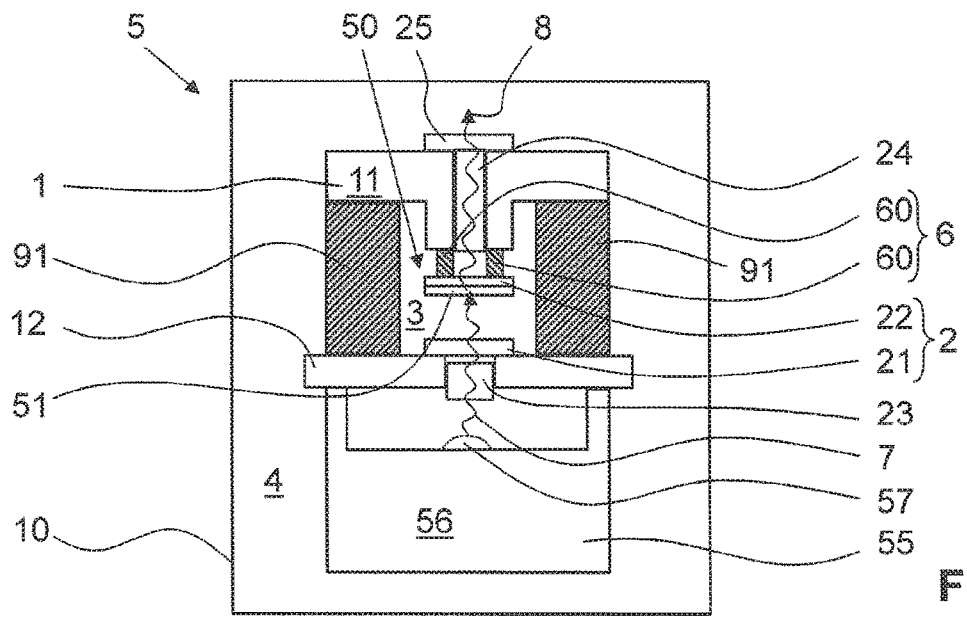
FIG. 1 shows schematically a first preferred embodiment of the laser device according to invention with a first container according to invention.

FIG. 1 shows a first preferred embodiment of a laser device 5 according to invention with a first container 1 according to invention.

The first container 1 is a hermetically sealed container defining an internal space 3 (inside) and an external space 4 (outside). The first container 1 is provided with a top element 11 and a bottom element 12, both being substantially plate-like and connected via piezoelectric crystal elements 91; the piezoelectric elements 91 are shaped and arranged to serve as side walls of the first container 1. Hence, elements 11, 12, 91 form container walls.

The piezoelectric elements 91 form part of a length change device 9 (see below) for changing the effective length of an external cavity 20 or the laser device 5. Alternatively, this length change device 9 may be dispensed with and the top and bottom elements 11, 12 are simply connected by conventional walls, wherein the container 1 is preferably provided as a single piece.

Alternatively or additionally to the length change device 9, an optical element for changing the effective optical length of the external cavity 20 may be introduced into the cavity 20.

Typical external dimensions of such a first container 1 may be 10×10×10 millimeters, an internal space 3 may thus be about 1 cubic centimeter or less. Of course, larger or smaller first containers may also be possible.

In the substantially plate-like shaped bottom element 12, a first through-opening 23 is provided; in the top element 11 a second through-opening 24 is provided. The first and second through-openings 23, 24 provide each a connection between the internal and the external space 3, 4. These openings 23, 24 are arranged at adequate positions such that they may serve for the purpose of allowing for a desired optical connection between said internal space 3 and external space 4.

The first through-opening 23 is hermetically sealed with a sealing mirror 21. This sealing mirror 21 is provided on a chip which is attached to the first container 1 to extend over the entire first through-opening 23, thereby hermetically sealing the first through-opening 23. This sealing mirror 21 is furthermore used a reflector, being part of an external cavity 20 of a vertical external cavity surface emitting laser (VECSEL) device 50 provided within the internal space 3. The latter VECSEL device 50 is the laser light producing unit of the laser device 5.

In FIG. 1, the sealing mirror 21 is attached to the inner surface of the first container 1. Alternatively, the sealing mirror 21 may also be attached to the outer surface of the first container 1. Said attachment may be a direct attachment of the mirror 21 to the first container 1, alternatively, an indirect attachment including intermediate layers between mirror 21 and container 1 (e.g. for insulation, positioning, or improved attachment purposes) may be arranged. Alternatively or additionally, the sealing mirror 21 may be shaped to fit, at least in part, into the through-opening 23. Preferably, the sealing mirror 21 is glued to the first container 1; other techniques may be used.

The second through-opening 24 is hermetically sealed with a conventional seal 25. This conventional seal 25 may be made from Germanium or Silicon.

In FIG. 1, the platelet-like seal 25 is attached on the inner surface of the first container 1. Generally, the seal 25 may be (directly or indirectly, cf. above) attached to the outer or inner surface of the first container 1, or it may be shaped to fit at least in part into the through-opening 24. Preferably, the seal plate 25 is glued to the first container 1; other techniques may be used.

The first through-opening 23 with sealing mirror 21 is adapted as entrance for an optical pump beam 7 for pumping the VECSEL device 50. The second through-opening 24 with seal 25 is adapted as exit for a laser emission beam 8 produced by the VECSEL device 50, i.e. it is transparent.

Optionally, further dedicated through-openings (not shown in the drawings), connecting the internal space 3 and the external space 4 to one another (always in terms of fluid connection), may be arranged in the first container 1 for the purpose of inserting parts of or associated with the laser device 5 into the internal space 3 and/or for removing such parts from the internal space 3. These dedicated through-openings may be sealed after completion of the assembly process.

The external cavity 20 of the VECSEL device 50 comprises the sealing mirror 21 and a second mirror 22 as reflectors. The second mirror 22 is provided on a laser chip, wherein the active layer or region 51 is provided on the second mirror 22.

An optical pump device 55 with a light emitting diode is provided for optically pumping the active region or layer 51. The light emitting diode is a cheap and reliable pump light source. The optical pump device 55 comprises a main body 56, the diode itself (not shown in the drawings), and, as light guiding means, a focal lens 57. The main body 56 is directly attached to the first container 1, preferably by means of glue. The optical pump device 55 is arranged with respect to the first container 1 such that the focal lens 57 has a distance to the active layer 51 (being in the internal space 3) which is substantially the same as a focal length of the focal lens 57, the latter length being in the range of about 0.5 to 3 millimeters in dependence on the numerical aperture of the focal lens, which is preferable 0.4 to 0.6.

The laser chip is attached to a cooling device 6 comprising Peltier elements 60. Preferably, the laser chip is attached directly onto the Peltier elements 60. For further improving the heat link between the second mirror 22 with active region 51 to the Peltier elements 60, a metal layer 61 (cf. FIG. 2) or another heat transfer improving layer may be placed between the Peltier elements 60 and the laser chip.

The Peltier elements 60 are attached to the top element 11, onto the inner surface at or close to an edge of the second through-opening 24. Thereby, the laser chip 22, 51 is arranged over the second through-opening 24. The generated laser light exits the cavity 20 and the first container 1 through the second through-opening 24 and the seal 25.

By means of the cooling device 6, a temperature of the active region 51 and the second mirror 22 may be kept at temperatures around 0° C. This improves efficiency of both, the active region 51 and the mirror 22.

Preferably, the internal space 3 is purged or filled with a dry gas or air such that a water-free atmosphere is present in internal space 3.

The length change device 9 with piezoelectric elements 91 may be used for tuning the length of the cavity 20 for desired laser emission characteristics (single- or multi-mode emission).

The assembled laser device 5 may be placed in a second container 10. The second container 10 is also hermetically sealed while containing a substantially water-free atmosphere stabilized at about 20° C. The second container 10 is advantageous, firstly, as the consequence of a possible break of the hermetical sealed hull of the first container 1 is mitigated and, secondly, as the precise alignment of the optical pump device 55 on the first container 1 is not put at risk due to change in the ambient conditions.

Figure 2:
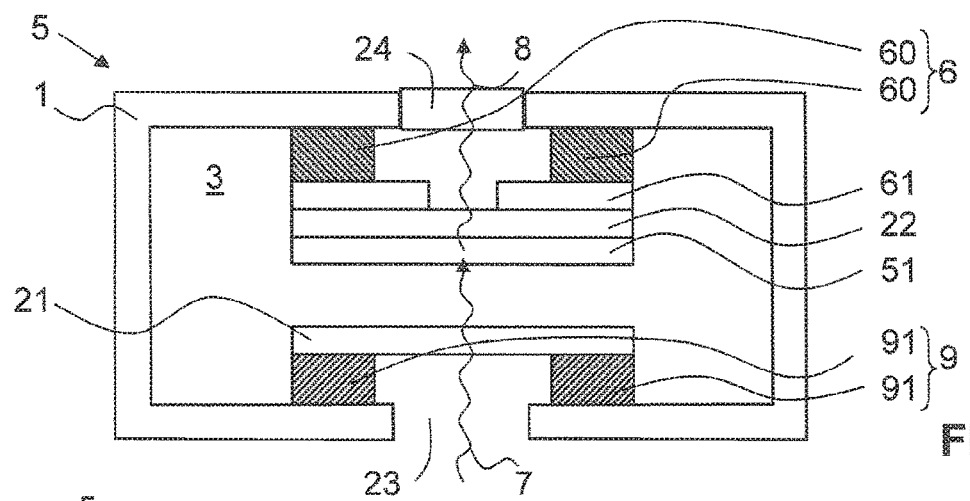
FIG. 2 shows schematically a second preferred embodiment of the laser device according to invention with a first container according to invention.

FIG. 2 shows a second preferred embodiment of the laser device 5. Parts with the same or a similar function as parts in the first embodiment according to FIG. 1 are designated with the same reference numerals.

In the second embodiment, the first container 1 is provided as a single piece with the first and the second through-opening 23, 24, as in the first embodiment, provided at essentially opposition sections of the first container 1. In contrast to the first embodiment, the second embodiment has the length change device 9 arranged between the inner surface of the first container 1 and the sealing mirror 21. The laser chip with the second mirror 22 and the active region 51 is again attached to the Peltier elements 60, wherein metal layers 61 are arranged between the second mirror 22 and the Peltier elements 60 and wherein the Peltier elements 60 are attached at or close to edges of the second through-opening 24, which is sealed with seal 25.

The pump device 55 and the second container 10 are not shown. Again, the pump beam 7 may enter through the first through-opening 23 while the laser emission beam 8 exits through the second through-opening 24.

Figure 3:
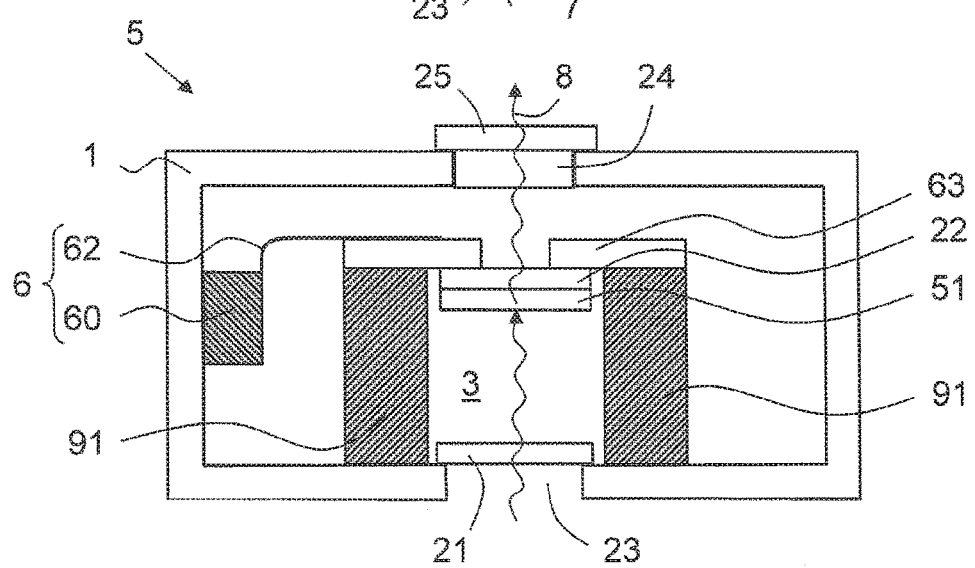
FIG. 3 shows schematically a third preferred embodiment of the laser device according to invention with a first container according to invention.

FIG. 3 shows a third preferred embodiment of the laser device 5. Parts with the same or a similar function as parts in the first embodiment according to FIG. 1 are designated with the same reference numerals.

Like in the second preferred embodiment, the first container 1 is provided as a single piece with the first and the second through-opening 23, 24, as in the first embodiment, provided at essentially diametrically opposing sections of the first container 1. In contrast to the second embodiment, the sealing mirror 21 is attached to the inner surface of the first container 1 like in the first embodiment while the piezoelectric crystal elements 91 are attached next to the sealing mirror 21 an extend into the internal space 3 along the direction of cavity 20. Therefore, the elements 91 at least partly surround the first through-opening 23. At free ends of the elements 91 a support layer 63 is attached which holds the laser chip 22, 51 with the second mirror 22 and the active region 51 such that the second mirror 22 and the active region 51 are arranged between the piezoelectric elements 91. Thereby, the length change device 9 may shift the position of the laser chip within the internal space 3.

Moreover, the cooling device 6 with the Peltier element 60 is provided at an inner surface of the first container 1, close to the support layer 63. The support layer 63 is preferably a good heat conductor and connected to the Peltier element 60 by means of heat link 62. Thereby, the cooling device 6 may cool the laser chip 22, 51 down to desired temperatures.

The pump device 55 and the second container 10 are not shown. Again, the pump beam 7 may enter through the first through-opening 23 while the laser emission beam 8 exits through the second through-opening 24.

The invention claimed is:

1. A laser device comprising:
   a vertical external cavity surface emitting laser device, a first container with an internal space accommodating the vertical external cavity surface emitting laser device;
   wherein said first container hermetically seals said internal space from an external space;
   wherein said first container comprises at least one container wall with at least one first through-opening;
   wherein said at least one first through-opening is adapted for passage of an optical pump beam from the external space into the internal space; and
   a sealing mirror chip and a sealing mirror on said sealing mirror chip located in said internal space inside said first container and covering said at least one first through-opening, wherein said at least one first through-opening is hermetically sealed by said sealing mirror on said sealing mirror chip such that said first through-opening with said sealing mirror on said sealing mirror chip is an entrance for said optical pump beam;
   said vertical external cavity surface emitting laser device comprising a laser chip including an active region and a second mirror, said laser chip being located in said internal space inside said first container; and
   wherein said sealing mirror chip with said sealing mirror and said laser chip are spaced apart to form an external cavity of the vertical external cavity surface emitting laser device in the internal space;
   wherein the first container has at least one second through-opening, said at least one second through-opening being hermetically sealed with a seal;
   and wherein said laser chip is located between said sealing mirror chip and said at least one second through opening; and
   wherein said laser device being adapted to feed a laser emission beam from the vertical external cavity surface emitting laser device from the internal space to the external space through said at least one second through opening and said second mirror.

2. The laser device according to claim 1, wherein a cooling device is accommodated within the internal space, said cooling device being adapted to cool down the internal space, to a temperature below 20° C.

3. The laser device according to claim 1, wherein the vertical external cavity surface emitting laser device is adapted for being pumped optically with an optical pump device, the optical pump device being accommodated in the external space.

4. The laser device according to claim 3, wherein the optical pump device includes a light emitting diode, wherein a focal length extending from a focal plane of a focal lens of the light emitting diode to the active region of the vertical external cavity surface emitting laser device ranges from 0.5 to 3 millimeters.

5. The laser device according to claim 3, being adapted to have the optical pump beam being at least one chosen from passing through the sealing mirror and the at least one first through-opening and being adapted to have the laser emission beam passing through the second mirror and the at least one second through-opening.

6. The laser device according to claim 1, comprising a cooling device adapted to cool down at least the active region of the vertical external cavity surface emitting laser device to or below substantially 0° C.,
  wherein said cooling device includes at least one cooling element, the cooling element (60) being a Peltier element, and wherein said cooling element is placed on the vertical external cavity surface emitting laser device or on an inner surface of the first container with a cold finger arranged between the cooling element and the vertical external cavity surface emitting laser device and an additional metal layer on the cooling element for establishing a better cooling contact of the cooling device to the vertical external cavity surface emitting laser device or the first container.

7. The laser device according to claim 1, wherein a cavity length of the external cavity has a length suitable for a single-mode emission or suitable for a multi-mode emission, and wherein an additional optical element is provided for tuning the external cavity to a predefined emission mode, preferably to single-mode emission.

8. The laser device according to claim 1, including a length change device within the first container for changing the cavity length of the external cavity.

9. The laser device according to claim 1, wherein at least one chosen from mirrors, through-opening seals, and the active region are formed to have a wedged shape such that at least one chosen from opposing surfaces of one mirror, through-opening, or active region are tilted with respect to one another by substantially 0.5 to 2° and that wedged elements are rotated with respect to one another by substantially 90° about an axis substantially normal to the respective surfaces.

10. The laser device according to claim 1, comprising a second container, wherein the first container is accommodated completely within said second container, and at least one chosen from wherein said second container contains a water-free atmosphere and wherein a temperature within said second container is stabilized to a predefined temperature.

11. Method of assembling a laser device according to claim 1, comprising:
  inserting at least one laser chip, the laser chip including the active region and the second mirror, and further inserting said sealing mirror chip with the sealing mirror, the cooling device, and the length change device into the internal space of the first container; and
  attaching attachments comprising said laser chip, said second mirror, the cooling device and length change device directly or indirectly to the first container by at least one chosen from soldering and gluing; and
  removing any mechanical parts that are only needed for assembling purposes through additional dedicated openings in the first container;
  removing water from the internal space of the first container by heating, filling-in dry air or a dry gas, and hermetically sealing all through-openings and additional dedicated openings; and
  positioning and attaching the optical pump device in the external space on the first container, wherein said attaching is carried out by a gluing process performed at a specific temperature; and
  including the first container with all said attachments into the second container which second container keeps the first container at least one chosen from in a water-free atmosphere and at said specific temperature.

12. The laser device of claim 1, wherein said at least one first through-opening is adapted for passage of a laser emission beam from the internal space into the external space.

13. The laser device according to claim 8, wherein said length change device includes a length change element, the length change element comprising a piezoelectric element.

14. The laser device according to claim 13, wherein said length change device is arranged between the sealing mirror and the first container or between the second mirror and the first container.

15. The laser device according to claim 2, wherein said cooling device being adapted to cool down the internal space including the sealing mirror including the vertical external cavity surface emitting laser device to a temperature below 20° C.

16. The laser device according to claim 2, wherein the cooling device includes a Peltier element.

17. The laser device according to claim 3, wherein the optical pump device being attached to the first container and the optical pump beam being fed through:
  the sealing mirror and the at least one first through-opening.

18. A laser device comprising:
  a vertical external cavity surface emitting laser device;
  a first container with an internal space accommodating the vertical external cavity surface emitting laser device;
  wherein said first container hermetically seals said internal space from an external space;
  wherein said first container comprises at least one container wall with at least one first through-opening;
  wherein a sealing mirror provided on a sealing mirror chip is located in said internal space inside said first container and covers said at least one first through-opening, said at least one first through-opening being hermetically sealed by said sealing mirror on said sealing mirror chip;
  and wherein said first container includes at least one second through-opening in said at least one container wall, said at least one sealed second though-opening being oppositely located in said first container to said at least one first through-opening;
  said vertical external cavity surface emitting laser device comprising a laser chip including an active region and a second mirror, said laser chip being located in said internal space inside said first container and covering said at least one second through-opening; and
  wherein said sealing mirror chip with said sealing mirror and said laser chip are spaced apart to form an external cavity of the vertical external cavity surface emitting laser device in the internal space;
  wherein said laser device being adapted to feed a laser emission beam from the vertical external cavity surface emitting laser device from the internal space to the external space through said at least one second through-opening and said second mirror.

19. The laser device as claimed in claim 1, wherein said sealing mirror comprises a distributed Bragg reflector.

20. The laser device as claimed in claim 1 wherein said sealing mirror is a flat mirror.

21. The laser device as claimed in claim 18 wherein said sealing mirror is a flat mirror.

* * * * *